(12) United States Patent  (10) Patent No.: US 8,916,022 B1
Caron  (45) Date of Patent: Dec. 23, 2014

(54) PLASMA GENERATOR SYSTEMS AND METHODS OF FORMING PLASMA

(75) Inventor: James Caron, Tracy, CA (US)

(73) Assignee: Novellus Systems, Inc., Fremont, CA (US)

( * ) Notice: Subject to any disclaimer, the term of this patent is extended or adjusted under 35 U.S.C. 154(b) by 1744 days.

(21) Appl. No.: 12/209,526

(22) Filed: Sep. 12, 2008

(51) Int. Cl.
  *H01L 21/306* (2006.01)
  *C23C 16/00* (2006.01)

(52) U.S. Cl.
  USPC .............. 156/345.48; 118/731 I; 118/723 AN

(58) Field of Classification Search
  CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183
  USPC ....... 118/723 I, 723 IR, 723 AN; 156/345.48, 156/345.49; 315/111.51; 216/68
  See application file for complete search history.

(56) References Cited

U.S. PATENT DOCUMENTS

| | | | |
|---|---|---|---|
| 2,518,709 A | 8/1950 | Mosby, Jr. | |
| 2,874,001 A | 2/1959 | Webb | |
| 4,421,592 A | 12/1983 | Shuskus et al. | |
| 4,718,976 A | 1/1988 | Fujimura | |
| 4,938,839 A | 7/1990 | Fujimura et al. | |
| 5,231,334 A | 7/1993 | Paranjpe | |
| 5,411,624 A | 5/1995 | Hirano et al. | |
| 5,436,528 A | 7/1995 | Paranjpe | |
| 5,439,524 A | 8/1995 | Cain et al. | |
| 5,503,881 A | 4/1996 | Cain et al. | |
| 5,556,501 A * | 9/1996 | Collins et al. ............ | 156/345.38 |
| 5,614,055 A | 3/1997 | Fairbairn et al. | |
| 5,855,725 A | 1/1999 | Sakai | |
| 5,919,382 A | 7/1999 | Qian et al. | |
| 6,013,155 A | 1/2000 | McMillin et al. | |
| 6,086,679 A | 7/2000 | Lee et al. | |
| 6,164,241 A | 12/2000 | Chen et al. | |
| 6,203,657 B1 | 3/2001 | Collison et al. | |
| 6,229,264 B1 * | 5/2001 | Ni et al. ................... | 315/111.51 |
| 6,247,425 B1 * | 6/2001 | Lymberopoulos et al. | . 118/723 I |
| 6,248,250 B1 | 6/2001 | Hanawa et al. | |
| 6,361,644 B1 | 3/2002 | Collins | |
| 6,379,576 B2 | 4/2002 | Luo et al. | |
| 6,444,084 B1 | 9/2002 | Collins | |

(Continued)

FOREIGN PATENT DOCUMENTS

WO  2008/143659  11/2008

OTHER PUBLICATIONS

U.S. Appl. No. 12/052,401, Office Action mailed Mar. 29, 2011.

(Continued)

*Primary Examiner* — Luz Alejandro Mulero
(74) *Attorney, Agent, or Firm* — Weaver Austin Villeneuve & Sampson LLP

(57) ABSTRACT

Systems and methods of forming plasma are provided. In an embodiment, by way of example only, a plasma generation system includes a container comprising an insulating material, a means for forming a first plasma within the container from a processing gas, the first plasma including charged particles, a means for extracting a portion of the charged particles from the first plasma and storing the portion of extracted charged particles on the insulating material, and a means for forming a second plasma from the extracted portion of the charged particles and a second portion of the processing gas.

20 Claims, 6 Drawing Sheets

(56) References Cited

U.S. PATENT DOCUMENTS

| | | |
|---|---|---|
| 6,450,117 B1 | 9/2002 | Murugesh et al. |
| 6,495,963 B1 | 12/2002 | Bennett |
| 6,551,447 B1 | 4/2003 | Savas et al. |
| 6,565,661 B1 | 5/2003 | Nguyen |
| 6,716,302 B2 | 4/2004 | Carducci et al. |
| 6,797,639 B2 | 9/2004 | Carducci et al. |
| 6,914,207 B2 | 7/2005 | Kawaguchi et al. |
| 7,361,228 B2 | 4/2008 | Choi et al. |
| 7,404,863 B2 | 7/2008 | Bergman |
| 7,482,247 B1 | 1/2009 | Papasouliotis et al. |
| 8,110,068 B2 | 2/2012 | Qiu et al. |
| 2001/0006093 A1 | 7/2001 | Tabuchi et al. |
| 2001/0047760 A1 | 12/2001 | Moslehi |
| 2002/0033233 A1 | 3/2002 | Savas |
| 2002/0039625 A1 | 4/2002 | Powell et al. |
| 2002/0088545 A1 | 7/2002 | Lee et al. |
| 2003/0041971 A1 | 3/2003 | Kido et al. |
| 2004/0221815 A1 | 11/2004 | Fukuda et al. |
| 2005/0011447 A1 | 1/2005 | Fink |
| 2005/0211168 A1 | 9/2005 | Yamada et al. |
| 2006/0000802 A1* | 1/2006 | Kumar et al. .................. 216/67 |
| 2006/0021574 A1 | 2/2006 | Armour et al. |
| 2006/0070702 A1 | 4/2006 | Kido et al. |
| 2006/0090852 A1 | 5/2006 | Kido et al. |
| 2006/0090853 A1 | 5/2006 | Kido et al. |
| 2006/0130756 A1 | 6/2006 | Liang et al. |
| 2006/0130759 A1 | 6/2006 | Kido et al. |
| 2006/0157199 A1 | 7/2006 | Kido et al. |
| 2006/0157201 A1* | 7/2006 | Hoffman et al. ......... 156/345.46 |
| 2007/0138134 A1 | 6/2007 | Hsieh et al. |
| 2007/0170156 A1 | 7/2007 | Hayashi |
| 2008/0156264 A1 | 7/2008 | Fair et al. |
| 2008/0156631 A1 | 7/2008 | Fair et al. |
| 2009/0236313 A1 | 9/2009 | Qiu et al. |
| 2009/0250334 A1 | 10/2009 | Qiu et al. |
| 2010/0294860 A1 | 11/2010 | Hsieh |
| 2010/0300359 A1 | 12/2010 | Armour et al. |
| 2012/0097331 A1 | 4/2012 | Qiu et al. |

OTHER PUBLICATIONS

U.S. Appl. No. 12/052,401, Notice of Allowance mailed Sep. 9, 2011.
U.S. Appl. No. 12/062,052, Office Action mailed Dec. 2, 2011.
U.S. Appl. No. 11/616,324, Office Action mailed Jul. 20, 2009.
U.S. Appl. No. 11/616,324, Office Action mailed Jan. 4, 2010.
U.S. Appl. No. 11/616,324, Office Action mailed Nov. 10, 2010.
U.S. Appl. No. 11/616,324, Office Action mailed Apr. 12, 2011.
U.S. Appl. No. 11/616,324, Office Action mailed Jun. 23, 2011.
U.S. Appl. No. 11/616,324, Notice of Allowance mailed Nov. 29, 2011.
U.S. Appl. No. 11/616,324, Allowed Claims, Nov. 29, 2011.
Savas, S. et al., "Using an ICP-based strip system to perform resist and barrier-layer removal in copper low-k processes," MICRO, October; Nov. 2004.
Luo, L. et al., "Characterization of a selectable-mode inductively coupled plasma (ICPsm) source for advanced dry residue removal applications," Mattson Technology, Inc., Abstract, 1998, ICPSM.
WO patent application No. PCT/US2007/064554, International Search Report and Written Opinion mailed Nov. 4, 2008.
U.S. Appl. No. 11/616,326, Office Action mailed Sep. 28, 2009.
U.S. Appl. No. 11,616,326, Office Action mailed Apr. 15, 2010.
U.S. Appl. No. 13/342,757, "Gas flow distribution receptacles, plasma generator systems, and methods for performing plasma stripping processes," Qiu et al., filed Jan. 3, 2012.
U.S. Appl. No. 11/616,324, Office Action, Apr. 30, 2012.
U.S. Appl. No. 12/062,052, Final Office Action mailed May 9, 2012.
U.S. Appl. No. 13/493,655, "Plasma Generator Apparatus," Fair et al., filed Jun. 11, 2012.

\* cited by examiner

PLASMA GENERATOR SYSTEMS AND METHODS OF FORMING PLASMA

TECHNICAL FIELD

The present invention generally relates to systems and methods of forming plasma and more particularly relates to plasma generator systems and methods of forming plasma using such plasma generator systems.

BACKGROUND

Plasma may be used in various processes for physically and/or chemically altering a surface of a workpiece. For example, plasma may be used to deposit or spray a layer of material onto a workpiece, to etch or sputter away unwanted material from a workpiece, or to perform ashing or stripping processes on a workpiece. Typically, plasma is generated using a plasma generator, which may include a tube, a coil, and a processing gas source. The tube may be made of a dielectric material, such as quartz or alumina/sapphire, and may be at least partially surrounded by the coil. An inner surface of the tube defines a plasma chamber that is in flow communication with the processing gas source to receive a processing gas. To diffuse the processing gas before injection into the plasma chamber, a gas flow distribution receptacle may be disposed over an inlet thereof.

During operation, the coil is energized to create an electric field within the plasma chamber. As the processing gas flows through the electric field, a portion of the processing gas is ignited and transforms into a plasma, which may include reactive species such as electrons, ions, and reactive radicals. The reactive species flow to the workpiece and, depending on the particular process in which the plasma is used, may deposit onto the workpiece to form a layer or may react with materials on the workpiece to form removable species.

Although the aforementioned system yields high quality plasma, the system may be improved. For example, plasma generation may not reliably occur on a first attempt and hence, repeated attempts may be performed before the processing gas is successfully ignited. In cases in which more than one workpiece is processed with the system, the repeat attempts at ignition may interrupt workpiece production, which may undesirably add time to workpiece processing. Additionally, a relatively large amount of power (e.g., at least 1000 Watts) may be supplied to the coil in order to ignite the processing gas. However, repeated exposure to the high voltages may affect operability of some of the system components that surround and/or are coupled to the coil, such as generators and/or matching network circuits. Hence, the surrounding system components may have reduced useful lives, thereby increasing repair frequency and costs.

Accordingly, it is desirable to have a plasma generator system that has improved plasma generation capabilities over conventional systems. It is also desirable for the plasma generator system to have reduced downtime between plasma generation processes. Additionally, it is desirable for the plasma generator system to generate plasma, while reducing exposure of surrounding system components to high amounts of power, as compared to conventional systems. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
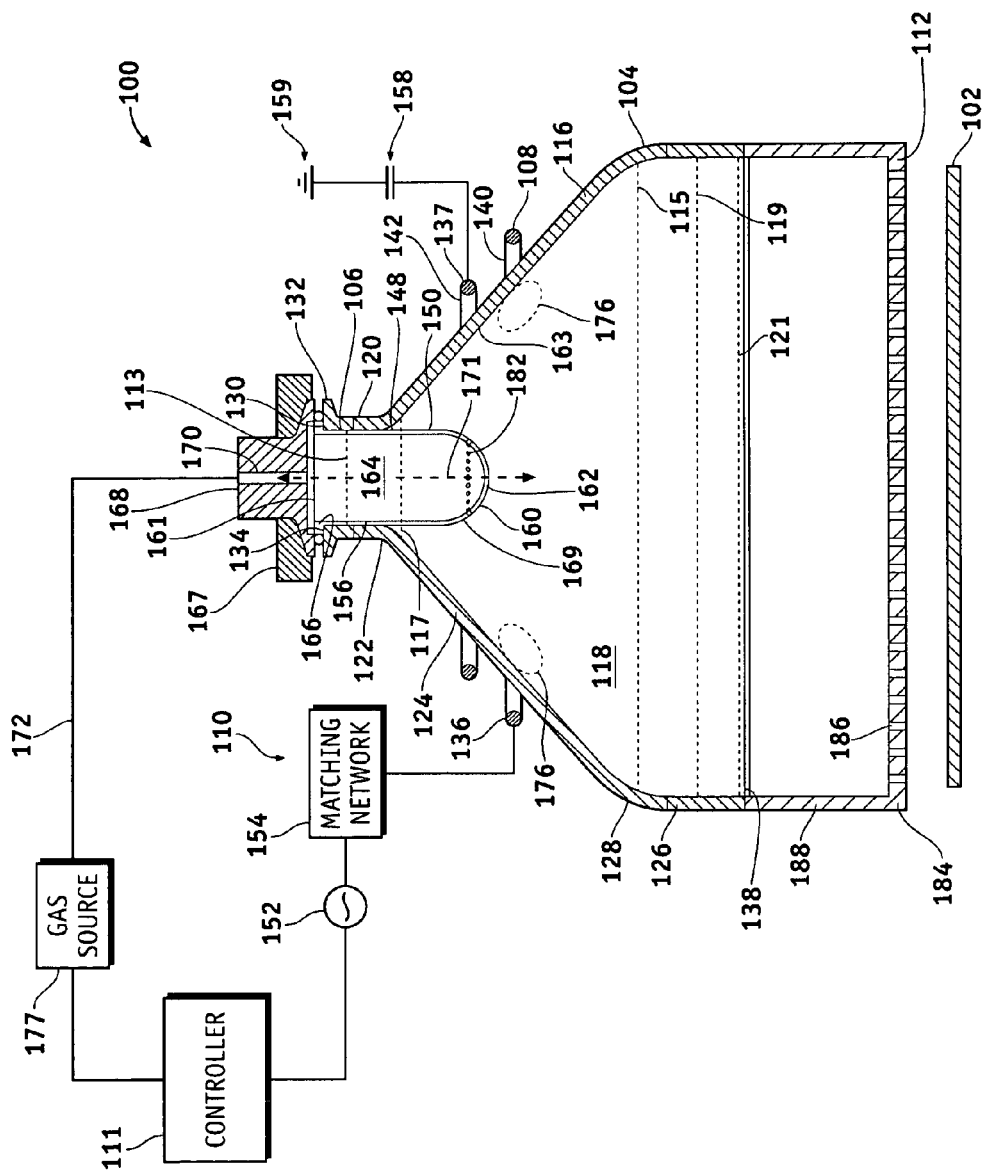
FIG. 1 is a simplified, cross-sectional view of a plasma generator system, according to an exemplary embodiment of the present invention.

FIG. 1 is a simplified, cross-sectional view of a plasma generator system 100, according to an exemplary embodiment of the present invention. The plasma generator system 100 is configured to generate plasma, which may be used to deposit or remove material from a workpiece 102. For example, the plasma generator system 100 may be used in conjunction with systems or components used for various plasma processing techniques, such as plasma enhanced chemical vapor deposition, plasma etching, plasma stripping or ashing, sputtering, plasma spraying, and the like. Accordingly, the workpiece 102 may be a substrate that may be subjected to one or more of the aforementioned processes. For instance, the workpiece 102 may be made of relatively pure silicon, germanium, gallium arsenide, or other semiconductor material typically used in the semiconductor industry, or of silicon admixed with one or more additional elements such as germanium, carbon, and the like, in an embodiment. In another embodiment, the workpiece 102 may be a semiconductor substrate having layers that have been deposited thereover during a conventional semiconductor fabrication process. In still another embodiment, the workpiece 102 may be a component, such as a sheet of glass, ceramic or metal that may be subjected to plasma processing.

The plasma generator system 100 may be a remote, stand alone apparatus or an in-situ module that is incorporated into a processing system. The plasma generator system 100 shown in FIG. 1 is an example of a remote apparatus. In accordance with an exemplary embodiment of the present invention, the plasma generator system 100 includes a container 104, a coil 108, an energy source 110, a controller 111, a gas flow distribution receptacle 106, and a showerhead 112. Although an in-situ module may not be configured identically to the embodiment shown in FIG. 1, it may include similar components.

The container 104 is configured to receive a processing gas that can be ionized by an electric field and transformed into a plasma, including species such as electrons, ions, and reactive radicals for depositing material onto or removing material from the workpiece 102. The container 104 is also configured to be capable of storing charged particles that may be used to form the plasma. In this regard, the container 104 is made of a material that is capable of enhancing the electric field and of at least temporarily storing the charged particles on its surface. In accordance with an exemplary embodiment, the container 104 may be made of a single material including the aforementioned properties. For example, the container 104 may be made of an insulating material, such as a dielectric material including, but not limited to quartz, alumina/sapphire, and ceramic. In accordance with another embodiment, the container 104 may be made of a first material capable of enhancing the electric field, and a second material capable of storing charged particles thereon. For example, the first material may be coated with the second material. According to an embodiment, the first material may be silver, and the second material may be a dielectric material including, but not limited to quartz, alumina/sapphire, and ceramic.

In any case, to contain the plasma in the container 104, the container 104 has a sidewall 116 that defines a plasma chamber 118. The sidewall 116 has any thickness that is suitable for containing plasma within the container 104 and that does not interfere with the electric field produced by the coil 108. In an exemplary embodiment, the sidewall 116 has a thickness in a range of from about 4 mm to about 6 mm. In another exemplary embodiment, the sidewall 116 has a substantially uniform thickness (e.g., ±0.5 mm) along its entire axial length. In still another embodiment, the sidewall 116 has a varying thickness along its axial length.

The sidewall 116, and hence, the plasma chamber 118, are shaped to allow the plasma to be directed toward the workpiece 102. In one exemplary embodiment, the sidewall 116 has a shape that varies along its axial length, as depicted in FIG. 1. For example, the sidewall 116 may include a neck section 120 extending from an inlet end 122 of a plasma-containing section 124 and a tube section 126 extending from an outlet end 128 of the plasma-containing section 124. The neck section 120 may be cylindrical and may have an inlet 130 and a lip 132 that protrudes radially outwardly from an end 134 of the neck section 120 proximate the inlet 130. In one exemplary embodiment, the neck section 120 has a substantially uniform diameter (shown as dotted line 113) (e.g., ±0.5 mm) along its axial length. In another exemplary embodiment, the neck section 120 has a varying diameter. In yet another exemplary embodiment, the diameter 113 is in a range of from about 20 mm to about 100 mm. In other embodiments, the container 104 may not include a neck section 120.

In any case, the plasma-containing section 124 includes an inlet 148 to the plasma chamber 118. According to a preferred embodiment, the plasma-containing section 124 may be cone-shaped and may have an outlet end diameter (shown as dotted line 115) that is greater than an inlet end diameter (shown as dotted line 117). In one exemplary embodiment, the outlet end diameter 115 is also greater than the diameter 113 of the neck section 120. In another exemplary embodiment, the outlet end diameter 115 is in a range of from about 250 mm to about 300 mm, while the diameter 113 of the neck section 120 is in the range of from about 25 mm to about 75 mm. In other embodiments, the diameters 115, 113 may be larger or smaller than the aforementioned ranges. In yet another exemplary embodiment, the outlet end diameter 115 is in a range of from about 400 mm to about 450 mm, while the diameter 113 of the neck section 120 is in the range of from about 40 mm to about 140 mm. In other embodiments, the diameters 115, 113 may be larger or smaller than the aforementioned ranges.

In accordance with another exemplary embodiment of the present invention, the tube section 126 has a substantially uniform diameter (shown as dotted line 119) that is substantially equal (e.g., ±0.5 mm) to the outlet end diameter 115 of the plasma-containing section 124. In another exemplary embodiment, the diameter 119 of the tube section 126 is greater than the outlet end diameter 115 of the plasma-containing section 124. In yet another exemplary embodiment, the diameter 119 of the tube section 126 is in a range of from about 280 mm to about 320 mm, and the outlet end diameter 115 of the plasma-containing section 124 may be in a range of from about 250 mm to about 300 mm. In other embodiments, the diameters 119, 115 may be larger or smaller than the aforementioned ranges. In yet another exemplary embodiment, the diameter 119 of the tube section 126 is in a range of from about 425 mm to about 475 mm, and the outlet end diameter 115 of the plasma-containing section 124 may be in a range of from about 400 mm to about 450 mm. In other embodiments, the diameters 119, 115 may be larger or smaller than the aforementioned ranges.

The tube section 126 includes an outlet 138 from the plasma chamber 118 that may be at least as large as a diameter of the workpiece 102. In an exemplary embodiment, the outlet 138 has a diameter (depicted as dotted line 121) that is in the range of from about 280 mm to about 320 mm. In another exemplary embodiment, the outlet 138 has a diameter 121 that is smaller than or larger than the aforementioned ranges. For example, in embodiments in which only a desired portion of the workpiece 102 is to be subjected to a plasma process, the diameter 121 of the outlet 138 corresponds to the size of the desired portion.

To provide an electric field within the plasma chamber 118, the coil 108 surrounds at least a portion of the container 104. In an exemplary embodiment, the coil 108 is made of a conductive material, such as copper, and has a first end 136 and a second end 137 between which windings 140, 142 are formed about the container 104. The first end 136 is electrically coupled to the energy source 110 and the first winding 140 extends from the first end 136. According to an embodiment, the first winding 140 makes one complete rotation about the container 104. In accordance with an embodiment, the second winding 142 extends from and is integral with the first winding 140. The second winding 142 encircles the container 104 once, terminating at the second end 137, which is electrically coupled to an electrical ground 159

In an exemplary embodiment, such as shown in FIG. 1, the first winding 140 is located below the second winding 142. In such case, because the first winding 140 is disposed around a portion of the plasma-containing section 124 that has a larger diameter than another portion thereof, the first winding 140 correspondingly has a larger diameter than the second winding 142. The first winding 140 may have a diameter in a range of between about 150 cm and about 200 cm, and the second winding 142 may have a diameter in a range of between about 200 cm and about 250 cm. However, it will be appreciated, that the dimensions of the windings 140, 142 may be larger or smaller than the aforementioned ranges depending on the dimensions of the outer diameter of the container 104. Although two windings 140, 142 are shown, a single winding or more than two windings may be included in other embodiments. For example, an additional winding may extend between the first and the second windings 140, 142 and may be coiled around the container 104.

Figure 2:
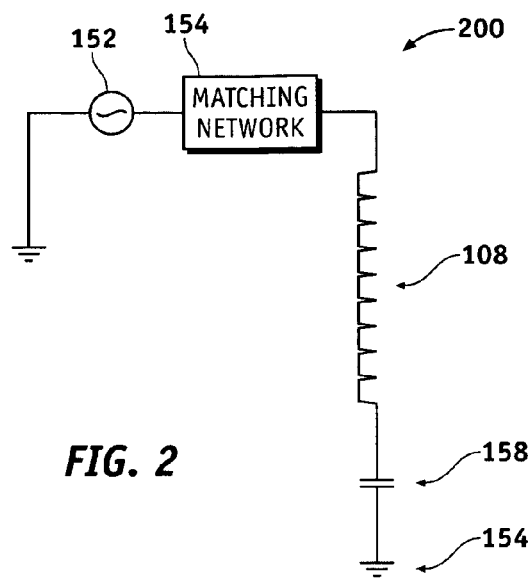
FIG. 2 is a simplified schematic of a circuit that may be implemented into a plasma generator system, according to an exemplary embodiment of the present invention.

The energy source 110 is electrically coupled directly to the first end 136 of the coil 108 to form a circuit. FIG. 2 is a simplified schematic of a circuit 200 comprising the coil 108, in accordance with an exemplary embodiment of the present invention, and may be referred to in conjunction with FIG. 1, as like components are represented by like reference numerals. The energy source 110 may be a radio frequency (RF) energy source or other source of energy capable of supplying power to and energizing the coil 108 to form an electric field. In an exemplary embodiment, the energy source 110 includes an RF generator 152 that is selected for an ability to operate at a desired frequency and to supply a signal to the coil 108. For example, the RF generator 152 may be selected to operate within a frequency range of about 0.2 MHz to about 20.0 MHz. In one exemplary embodiment, the RF generator 152 may operate at 13.56 MHz. In an exemplary embodiment, the energy source 110 may include a matching network 154 disposed between the RF generator 152 and the coil 108. The matching network 154 may be an impedance matching network that is configured to match an impedance of the RF generator 152 to an impedance of the coil 108. In this regard, the matching network 154 may be made up of a combination of components, such as a phase angle detector and a control motor; however, in other embodiments, it will be appreciated that other components may be included as well.

In another exemplary embodiment of the circuit 200, a capacitor 158 is included to limit voltage flow through the coil 108. In this regard, the capacitor 158 is selected to have a capacitance that limits a peak-to-peak voltage flow through the coil 108 to a threshold voltage. According to an exemplary embodiment of the present invention, the threshold voltage may depend on an impedance value of the coil 108 and the RF generator 152. In an example, the capacitor 158 may be selected for an ability to limit voltage flow through the coil 108 to about 50% of an initial voltage measured at an input location (e.g., at the firsts winding 140). According to another exemplary embodiment of the present invention, the capacitor 158 is also selected for an ability to enhance the impedance-matching capabilities of the matching network 154 to match the impedance of RF generator 152 to that of the coil 108. In any case, the capacitor 158 may be electrically coupled to the coil 108. In accordance with an embodiment, the capacitor 158 is coupled between the second end 137 of the coil 108 and the electrical ground 159. In another embodiment, the capacitor 158 is coupled between the energy source 110 and the coil 108. According to still another exemplary embodiment, the capacitor 158 is coupled between the first and the second windings 140, 142.

Returning to FIG. 1, to control a manner in which the energy source 110 operates, the controller 111 is operatively coupled thereto. The controller 111 may be an analog controller, a discrete logic controller, a programmable array controller (PAL), a programmable logic controller (PLC), a microprocessor, a computer or any other device capable of carrying out the sequence of events outlined in method 700 described below. In one exemplary embodiment, the controller 111 determines a magnitude of power to be supplied to the coil 108 and provides commands to the energy source 110. In addition to controlling the energy source 110, the controller 111 may also be operatively coupled to a processing gas source 177 and may provide commands thereto to supply an amount of processing gas to the plasma chamber 118.

The processing gas may be diffused before being injected into the plasma chamber 118. In this way, the gas may be substantially uniformly distributed into the plasma chamber 118. In one exemplary embodiment, the gas flow distribution receptacle 106 is disposed in the plasma chamber inlet 148 and has any one of numerous shapes. The particular shape and position of the gas flow distribution receptacle may determine a location of a plasma zone 176 in the container 104. The plasma zone 176 may be defined as a region within the plasma chamber 118 having a highest concentration of plasma formation during processing. According to one exemplary embodiment, the gas flow distribution receptacle 106 includes a cup member 150 and is made of a material that is non-conductive and is capable of withstanding corrosion when exposed to the processing gas. Suitable materials include, for example, dielectric materials such as quartz.

The cup member 150 may include a cylindrical section 156 and a rounded section 160. The cylindrical section 156 may define a portion of a reception cavity 164 having an open end 161. Additionally, the cylindrical section 156 may have an outer diameter that is less than the inner diameter of the plasma chamber inlet 148. In an exemplary embodiment, a flange 166 extends radially outwardly from the cylindrical section 156. The flange 166 may be used to retain the gas flow distribution receptacle 106 in position on the container 104 and may be clamped between a housing 168 and the container 104. In this regard, the outer diameter of the flange 166 is larger than an inside diameter of the neck section inlet 130. In an exemplary embodiment, the outer diameter of the flange 166 is substantially equal (e.g., ±0.5 mm) to the outer diameter of the container lip 132. In other examples, the outer diameter of the flange 166 may be larger or smaller. In another exemplary embodiment, the housing 168 has a diameter that is substantially equal to (e.g., ±0.5 mm) or larger than an outer diameter of the flange 166. For example, the flange 166 may have an outer diameter that is in the range of from about 50 mm to about 75 mm, and the housing 168 may have a diameter that is larger. In other embodiments, the diameters may be smaller or larger. A clamping fixture 167 may surround at least the flange 166, the housing 168, and the container lip 132 to ensure that the gas flow distribution receptacle 106 remains disposed at a desired location on the container 104. To allow access into the reception cavity 164, the housing 168 may include one or more openings 170. The openings 170 may be configured to receive one or more corresponding gas connection lines 172 to provide flow communication with the processing gas source 177.

The rounded section 160 is generally hemispherically-shaped and has a longitudinal axis 171 that extends therethrough and through the reception cavity 164. Gas injection openings 182 are included within the rounded section 160 and are adapted to provide flow communication between the reception cavity 164 and the plasma chamber 118. To control the manner in which the processing gas is injected into the plasma chamber 118, the gas injection openings 182 may be formed and positioned so that the processing gas flows along predetermined gas injection paths. The gas injection paths generally allow the gas to flow axially from the reception cavity 164 through openings 182 to the plasma-containing section 124 of the container 104. It will be appreciated that the particular number of openings 182, the size of the openings 182, and the direction in which the openings 182 are formed relative to an outer surface 169 of the receptacle 106 may be further selected to control the manner in which the gas is injected. For example, to substantially evenly distribute the processing gas within the plasma chamber 118, twenty to forty openings 182 may be included. In other embodiments, more or fewer openings 182 may be included. In one exemplary embodiment, the openings 182 are disposed symmetrically about the longitudinal axis 171 and are substantially evenly spaced around a circumference of the rounded section 160 to form a ring. In another exemplary embodiment, the openings 182 are not evenly spaced around a circumference of the rounded section 160. For example, two or more openings may be formed close together to form a set, and each set may be equally spaced from the longitudinal axis 171. In any case, the openings 182 are spaced such that the processing gas may be substantially evenly injected into the plasma chamber 118.

In one exemplary embodiment of the present invention, each opening 182 has a diameter that is substantially identical (e.g., ±0.5 mm) to a diameter of an adjacent opening 182. In another exemplary embodiment, the openings 182 have diameters that vary within a range. For example, each opening 182 may have a diameter that is within a range of from about 0.5 mm to about 3.0 mm. In other examples, the openings 182 may be larger or smaller than the aforementioned diameter range.

With continued reference to FIG. 1, when the energy source 110 energizes the coil 108, an electric field is formed in a selected portion of the plasma chamber 118 to thereby ionize the processing gas that may flow therethrough to form ionized gas. As used herein, the term "ionized gas" may include, but is not limited to, charged particles, ions, electrons, neutral species, excited species, reactive radicals, dissociated radicals, and any other species that may be produced when the processing gas flows through the electric field. To control dispersion of the ionized gas across the work piece 102, the showerhead 112 may be positioned at the plasma chamber outlet 138. In one exemplary embodiment, the showerhead 112 includes a plate 184. The plate 184 may be made from any suitable material that is relatively inert with respect to the plasma, such as alumina or ceramic. Generally, the plate 184 is sized to allow gas dispersion over an entirety of the workpiece 102 and thus, has a correspondingly suitable diameter.

The plate 184 is relatively porous to allow gas passage therethrough. In particular, the plate 184 includes through-holes 186 that are suitably sized and spaced to disperse the ionized gas over the work piece 102 in a substantially uniform manner. In one exemplary embodiment, the through-holes 186 have a diameter in a range of from about 2 mm to about 10 mm. In another exemplary embodiment, the through-holes 186 are present at a surface density in a range of from about 0.005 holes/mm$^2$ to about 0.2 holes/mm$^2$. In other embodiments, the through-holes 186 have larger or smaller dimensions than the ranges previously provided. In another exemplary embodiment, the through-holes 186 are substantially uniformly sized (e.g., ±0.5 mm). Additionally, the through-holes 186 are disposed in a substantially uniform pattern on the showerhead 112 in one exemplary embodiment but, in another exemplary embodiment, the through-holes 186 are disposed in a non-uniform pattern.

In an exemplary embodiment of the present invention, the showerhead 112 is directly coupled to the container 104, as shown in FIG. 1. For example, the showerhead 112 may include sidewalls 188 that extend axially from the plate 184 and that are coupled to the container 104 via bolts, clamps, adhesives or other fastening mechanisms. In another embodiment, the showerhead 112 may be integral with the container 104. The sidewalls 188 may be used to provide additional distance between the plasma zone 176 and the workpiece 102, and thus, may be configured accordingly.

Figure 3:
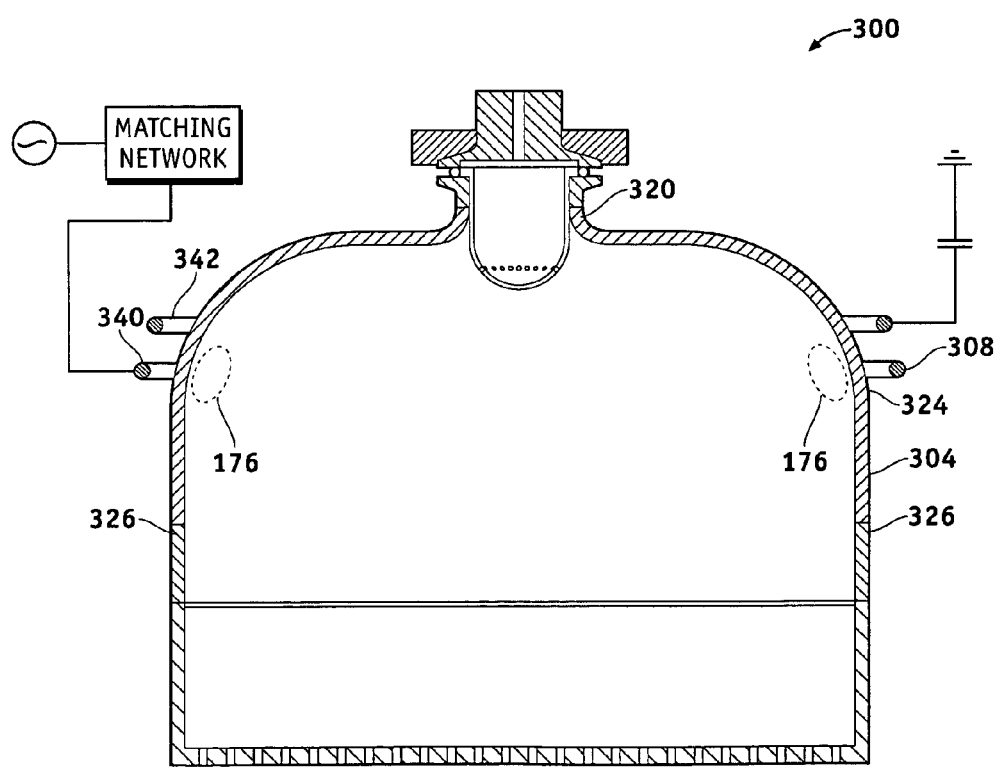
FIG. 3 is a close-up cross-sectional view of a rounded section of the gas flow distribution receptacle of FIG. 1, according to an exemplary embodiment of the present invention.

It will be appreciated that, although FIG. 1 illustrates an embodiment of the plasma generator system 100 including certain components, additional components or components shaped differently than those shown in FIG. 1 may alternatively be employed. For example, in accordance with another exemplary embodiment of the present invention, FIG. 3 illustrates a plasma generator system 300 that includes substantially identical components as system 100, except that a plasma-containing section 324 of a container 304 of the system 300 is dome-shaped. Although a neck section 320 is shown as extending from the plasma-containing section 324, other embodiments may not include the neck section 320. Additionally, although a first winding 340 and a second winding 342 of a coil 308 are shown as being disposed around the plasma-containing section 324, the windings 340, 342 of the coil 308 alternatively may be disposed between a tube section 326 and the plasma-containing section 324, in another exemplary embodiment.

Figure 4:
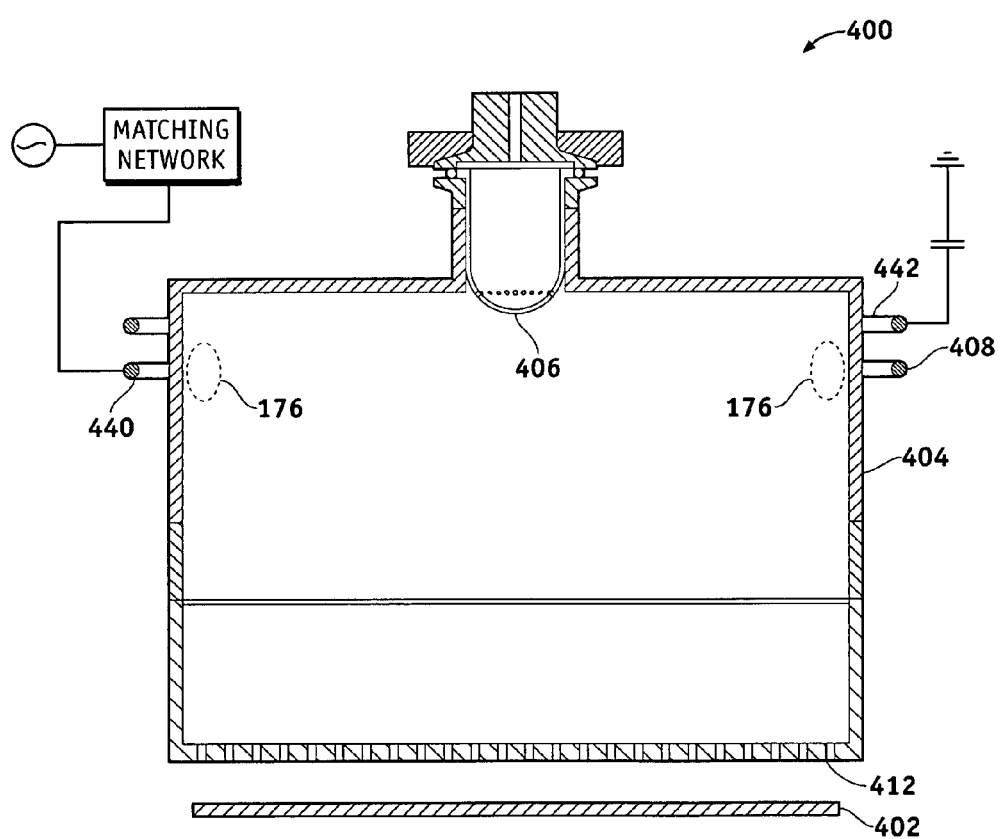
FIG. 4 is a simplified, cross-sectional view of a plasma generator system, according to an exemplary embodiment of the present invention.

FIG. 4 is a cross-sectional view of a plasma generator system 400 according to yet another exemplary embodiment of the present invention. Here, the plasma generator system 400 includes substantially similar components as those of systems 100 and 300, except that a container 404 of the system 400 has a substantially uniform diameter along its entire axial length. Accordingly, a coil 408 surrounds a portion of the container 404 and includes a first winding 440 and a second winding 442 having substantially equal diameters to each other. Additionally, as shown in FIG. 4, dimensions and placement of a showerhead 412, workpiece 402, and a gas flow distribution receptacle 406 relative to the coil 408 may differ from systems 100, 300 due to the shape of the container 404.

Figure 5:
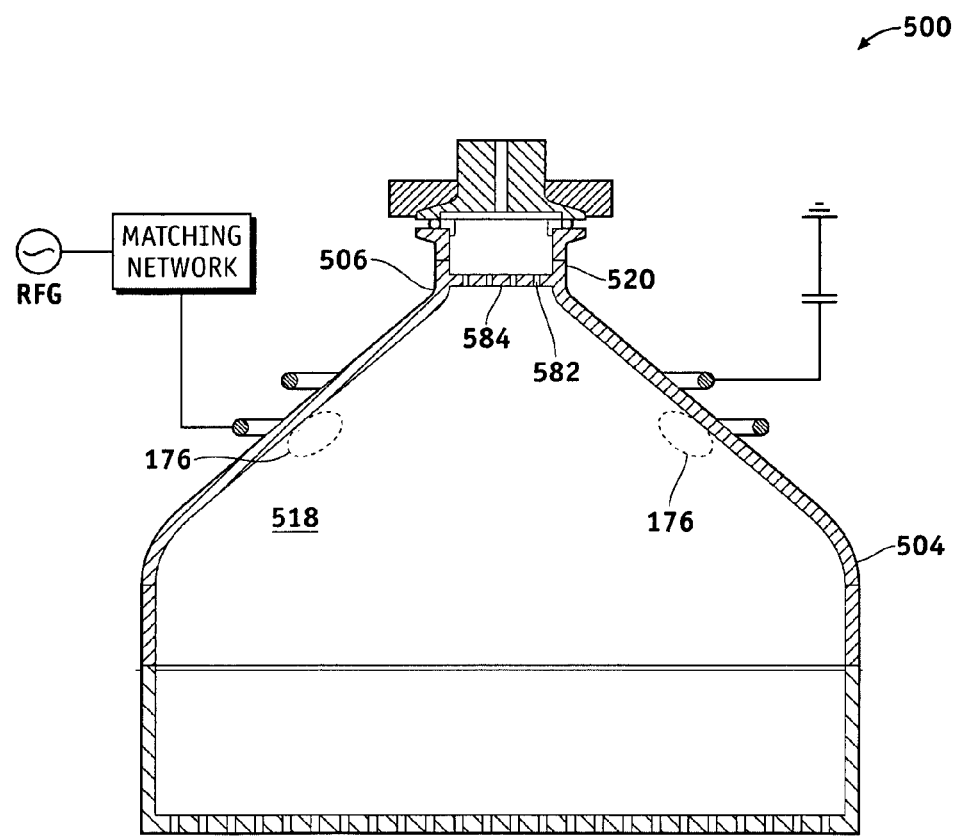
FIG. 5 is a simplified, cross-sectional view of a plasma generator system, according to an exemplary embodiment of the present invention.

FIG. 5 is a cross-sectional view of a plasma generator system 500 according to another exemplary embodiment of the present invention. The system 500 is similar to system 100 described above, but includes a gas flow distribution receptacle 506 that is formed as part of a neck section 520 of a container 504 and comprise a plate 584 is disposed upstream of an inlet to a plasma chamber 518. The plate 584 includes openings 582 through which processing gas flows during operation, and the openings 582 are formed substantially similarly to those included in gas distribution receptacle 106 in FIG. 1.

Figure 6:
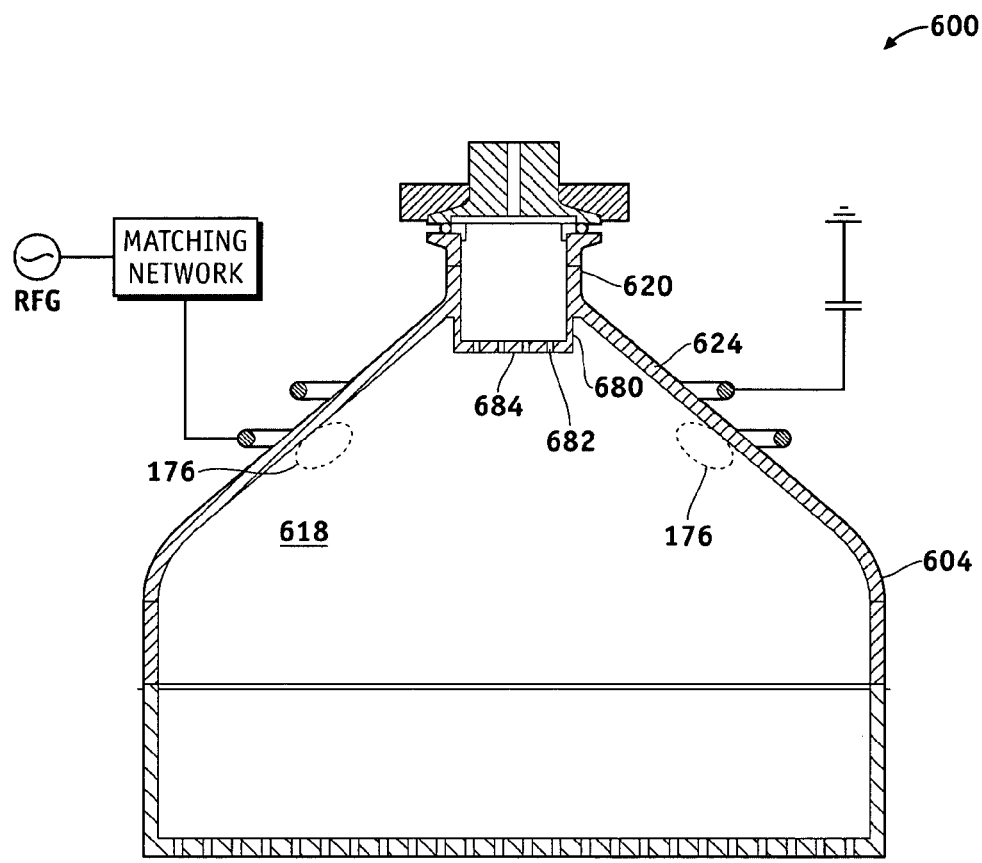
FIG. 6 is a simplified, cross-sectional view of a plasma generator system, according to an exemplary embodiment of the present invention.

In still another exemplary embodiment of the present invention, FIG. 6 is a cross-sectional view of a plasma generator system 600 that is similar to system 500 described above, except that a plate 684 is disposed within a plasma-containing section 624 of a container 604. According to an exemplary embodiment, a cylindrical sidewall 680 extends from a neck section 620 of the container into a plasma chamber 618 defined by the plasma-containing section 624, and the plate 684 encloses an end of the neck section 620. Openings 682 are formed in the plate 684 substantially similarly to those included in system 600.

Figure 7:
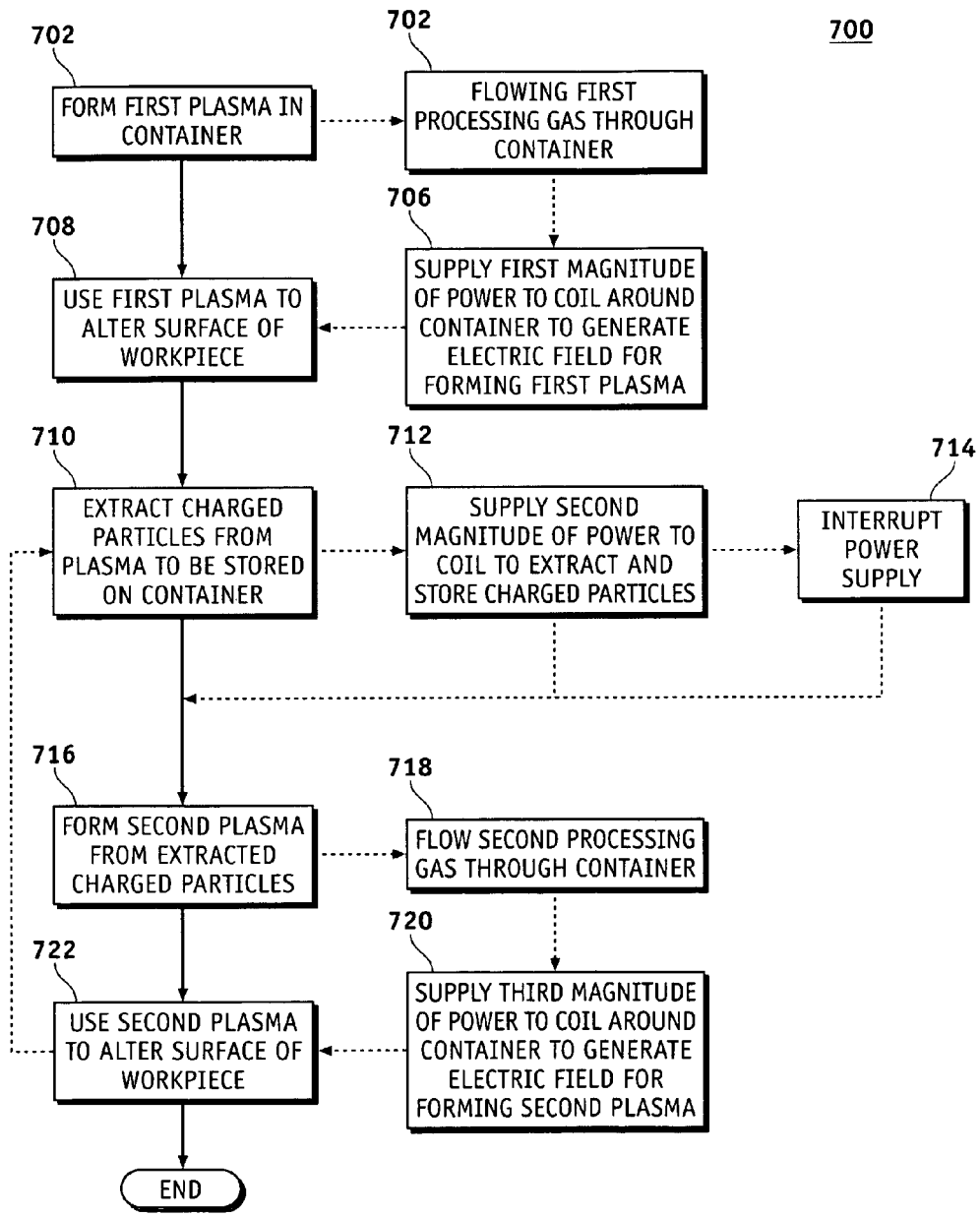
FIG. 7 is a flow diagram of a method of forming plasma, according to an exemplary embodiment of the present invention.

Regardless of the particular physical embodiment of the system 100, each embodiment operates according to a similar method. FIG. 7 is a flow diagram of a method 700 of forming plasma, according to an exemplary embodiment, that may be used with systems 100, 300, 400, 500, and 600 and a controller, such as controller 111, may be adapted to cause the system 100 to perform one or more steps of method 700. For example, the controller may be adapted to provide commands to an energy source, such as energy source 110, to perform the various steps below, and/or the controller may be adapted to provide commands to a processing gas source, such as processing gas source 177, to perform one or more of the various steps below. In an exemplary embodiment, a first plasma is formed within a container, step 702. The first plasma may be formed at any stage of workpiece processing during which a plasma chamber within the container is substantially free of plasma and/or reactive species. For example, the first plasma may be formed at an initiation of a plasma generation process immediately after the plasma generator system is powered on. In another embodiment, the first plasma may be formed after a prolonged period of system down-time. Depending on the particular gases that may be present in the container and the dimensions of the container, the prolonged period may be a length of time that is greater than about 2 minutes.

In accordance with an exemplary embodiment, step 702 may include flowing a processing gas through the container, step 704. The processing gas may be injected into the container through an inlet of the container. According to an exemplary embodiment, the processing gas may be flowed through a gas distribution receptacle located at the inlet of the container. In one example, the gas distribution receptacle may have a plurality of openings formed therein at an angle relative to a longitudinal axis extending therethrough to allow a majority of the processing gas to flow through the container at desired regions therein. As described above, the desired regions may include plasma zones that define locations at which a highest concentration of plasma may be formed.

The particular gas selected as the processing gas may depend on the particular process in which the plasma may be used. In an exemplary embodiment, the processing gas includes a fluorine-comprising gas. Examples of fluorine-comprising gases suitable for use include nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. In another embodiment, the processing gas may additionally comprise an oxygen-comprising gas. For example, the oxygen-comprising gas may include, but is not limited to, oxygen ($O_2$) and $N_2O$. In other embodiments, the processing gas may additionally comprise an inert gas, such as, for example, nitrogen ($N_2$), helium, argon, and the like. In one exemplary embodiment, the processing gas may be used in a plasma stripping process and may be a mixture of gases, such as $O_2/N_2/CF_4$ at a ratio of 20:8:1 by flow percent. In other embodiments, the mixture may include different ratios of the aforementioned gases. In still other embodiments, different gases and different ratios may be used.

In accordance with another exemplary embodiment, step 702 may further include forming an electric field in the container to form the first plasma, step 706. In accordance with an exemplary embodiment of the present invention, step 706 may include supplying a first magnitude of power to a coil of the system to form the electric field. The coil may include two windings disposed adjacent to each other along an axis (e.g., first and second windings 140, 142). In an embodiment, the first magnitude of power is a magnitude that is sufficient to cause the system to experience an inductive mode into which the system transitions from an initial capacitive mode. In this way, the first magnitude of power may be a value in a range having a lower limit and an upper limit, where the lower limit is a power magnitude that is suitable for transitioning the system from the capacitive mode to the inductive mode, and the upper limit is a pre-determined system design limit.

During operation, two different electric field configurations are created, namely, a capacitive-coupled electric field and an inductive-coupled electric field. The capacitive-coupled electric field is defined by electric field lines that extend between adjacent windings of the coil and having a component normal to the surface of the container. The inductive-coupled electric field is created when the current in the coil creates an RF magnetic field which penetrates the plasma container and induces an electric field as described by Faraday's Law. The inductive-coupled electric field has electric field lines that typically have no component normal to the surface of the chamber, When the system is powered on and power is initially supplied to the coil, the relative strength of the electric field in the capacitive mode is greater than that of the inductive mode. In such case, the system is in a "capacitive mode". As the power is increased, the strength of the inductive mode electric field increases, as the relative strength of the capacitive mode electric field decreases. This may result from an increase of power absorbed by the plasma, resulting in an increase in the number of charged particles to increase a magnitude of current in the coil and in a larger percentage of power coupled into the inductive mode. At a certain power level, the system may experience a mode transition (also known by those skilled in the art as a "mode jump"), where a rapid increase in the inductive-coupled power along with an associated rapid decrease in the capacitive-coupled power may occur. In such case, the system is in an "inductive mode".

A particular magnitude of power suitable for transitioning from the capacitive mode into the inductive mode may depend on system designs. Specifically, the particular current, voltage, and power required to create the capacitive and/or inductive mode depends largely on the configuration and dimensions of the container and the coil, the process chemistry and process parameters. In accordance with an exemplary embodiment, the system may be configured similar to FIG. 1. In such case, the system may be designed such that the first magnitude of power has a lower limit of about 1000 watt, which may be employed to transition the system from a capacitive mode to an inductive mode, and an upper limit of about 2000 watts, wherein the inductive mode may be maintained up to a power supply of 2000 watts. In another exemplary embodiment, the first magnitude of power may be in a range of from about 1000 watts to about 5000 watts. In yet another exemplary embodiment, the first magnitude of power may be in a range of from about 1200 watts to about 10,000 watts. In still other embodiments, a particular power magnitude may be more or less than either of the aforementioned ranges.

Step 704 and/or the combination of steps 704 and 706 may be repeated more than once, in an embodiment. These steps may need to be repeated for various reasons. For example, a lack of charged particles available for ignition may create a longer ignition time than the RF components can tolerate or a major change in RF impedance matching conditions in an attempt to couple power into this low charge state. This may create a condition which the matching network cannot recover from and after this failed attempt at ignition the RF may need to be turned off to allow a matching network to re-establish tuning conditions necessary for the transition from capacitive mode to inductive mode. Although steps 704 and 706 are listed as occurring in sequence, this may not always be the case. For example, step 704 may occur after step 706, in another exemplary embodiment. In yet another exemplary embodiment, intervening steps not describe may occur between steps 704 and 706.

After the first plasma is formed, it may be used in various processes in which plasma may be employed to alter a surface of a workpiece, step 708. In accordance with an exemplary embodiment, a continuous supply of the processing gas may be fed into the container and allowed to circulate with the first plasma and through the electric field, and RF current is continuously supplied to the coil such that the inductive mode produces an RF electric field within the chamber. As the processing gas circulates, charged particles making up the plasma are accelerated within the container causing at least a portion of the processing gas to dissociate into reactive radicals, which may be flowed to a workpiece disposed at an outlet of the container. For example, in an embodiment in which the processing gas includes a fluorine-comprising gas, a portion of the fluorine-comprising gas ionizes to form electrons, fluorine ions and reactive fluorine radicals. In an exemplary embodiment of the present invention, some of the reactive fluorine radicals may flow through the plasma chamber, through a showerhead, and may deposit on the workpiece, while another portion of the reactive fluorine radicals may recirculate within the plasma chamber before depositing onto the workpiece. After the workpiece is processed, it may be moved to another portion of the system.

In another exemplary embodiment, after the workpiece is processed, charged particles are extracted from the first plasma and stored on a surface of the container, step 710. To extract the charged particles, the system is transitioned from the inductive mode to the capacitive mode. By changing the coupling mode from inductive to capacitive, the electric field lines change from extending azimuthally along a radius of the chamber with no component normal to the surface of the chamber to extending between components of the coil or between a component of the coil and other surfaces of the source with components normal to the surface of the container. Accordingly, charged particles that may be present in the inductive mode and those created during the transition to capacitive mode move with the shifting field lines as the mode transitions to the capacitive mode. Because the field lines of the capacitive mode can create charged particles and have a component normal to the wall of the container, some of the charged particles ether created or present in the container may be transported to and subsequently maintained against the surface of the container. In this way, the surface of the container acts as a storage device for the charged particles.

In an exemplary embodiment, a second magnitude of power may be supplied to the coil to extract and store charged particles on the container, step 712. In an exemplary embodiment, the second magnitude of power is employed to transition the mode from inductive to capacitive. The particular magnitude of power used for the second magnitude of power may vary from system to system. In accordance with one exemplary embodiment, the second magnitude of power may be substantially equal to (within about 10.0% of) the first magnitude of power. In another exemplary embodiment in which minimum power consumption is desired, the second magnitude of power may be an amount of power that is substantially less than the first magnitude of power of step 706. For example, the second magnitude of power may be in a range of about 0.05% to about 20% of the first magnitude of power. In another example, using the embodiment described above in which the system is configured as a 2 kilowatt system, the first magnitude of power may be in a range of from about 1000 watts to about 1400 watts, while the second magnitude of power may be a magnitude that is less than the 1000 watts. In another exemplary embodiment, the second magnitude of power may be an amount of power suitable for maintaining the capacitive mode. In one example, the second magnitude of power may be in a range of about 50 watts to about 400 watts, which may be a sufficient amount to maintain a capacitive mode. Thus, the second magnitude of power may be in a range of from about 50 watts to about 400 watts to 1000 watts of power, in one embodiment, or from about 50 watts to about 400 watts to about 1200 watts, another embodiment.

In another exemplary embodiment, the power supplied to the coil may drop immediately from the first magnitude to the second magnitude. According to another embodiment, the power supplied to the coil may gradually change from the first magnitude to the second magnitude. In still other embodiments, the power supplied to the coil may be provided at the first magnitude, an interruption in the supply of power may occur for a few seconds (for example, between about 0.1 second to about 1 second), and then the second magnitude may be supplied.

The system may be maintained in the capacitive mode for a predetermined length of time. The length of time may be based on the particular magnitude of power supplied to the system and a maximum acceptable quantity of sputtering that the surface of the container may withstand before an undesirable amount of particles are created. For example, the length of time may be in a range of about 0.1 seconds to about 1.5 seconds. In one exemplary embodiment, the predetermined length of time may be shorter in an embodiment in which the magnitude of power is relatively high. Likewise, the predetermined length of time may be longer in an embodiment in which the magnitude of power is relatively low. In yet another exemplary embodiment, the system may be maintained in the capacitive mode for a substantially longer time. This longer length of time may be needed for several reasons. For example, the capacitive mode may be maintained between wafer lots where there may be times between plasma ignitions that are substantially longer than the charge storage time.

After the charged particles are collected on the surface of the container, the supply of power to the coil may be interrupted such that capacitive mode ceases, step 714. For example, the system may be placed in a standby operating mode, where the system is powered on, but consumes a magnitude of power that is less than that suitable for generating and storing charged particles in the container. In such case, plasma generation and charge storage may not occur and the current and hence, power, to the coil may be less than about 50 watts. In a particular embodiment, the magnitude of power is less than the second magnitude of power. In another exemplary embodiment, the system may be powered off and the current supply and hence, the power supply, may be zero.

Although a quantity of charged particles may be initially stored on the surface of the container immediately after the interruption, as the magnitude of power supplied to the coil remains less than a magnitude suitable for maintaining a charge in the capacitive mode, the charged particles may lose energy, and thus lose charge, over time. Hence, a quantity of charged particles within the container may be reduced. Therefore, the duration of the interruption may be limited to a time period during which the surface of the container includes an acceptable quantity of the remaining stored charged particles. The acceptable quantity of stored charged particles may vary from system to system depending on particular system parameters, but in any event, includes a minimum amount of charged particles that may be employed to produce a rapid plasma ignition. Because the minimum quantity of charged particles may vary, the duration of the interruption may vary as well. For example, the time period may be in a range of about 10 seconds to about 30 minutes. In accordance with one exemplary embodiment, the time period may be up to about 10 minutes. However, it will be appreciated that the particular time period may depend further on the composition of the processing gas employed for a previous plasma process, the processing gas employed for the next plasma ignition, the dimensions of the container, the magnitude of power used to generate the plasma, and other parameters.

A second plasma is formed from the portion of the extracted charged particles, step 716. In accordance with an exemplary embodiment, step 716 may include flowing a second processing gas through the container, step 718. In such case, step 718 may be performed in a similar manner as step 702. For example, a second processing gas may be injected into the container through the gas distribution receptacle. In one example, the second processing gas may have a substantially identical formulation to the first processing gas. In another example, the second processing gas may have a different formulation than the first processing gas. In any case, the particular gas selected for the first processing gas may depend on the particular process in which the plasma may be used, and may be selected from the gases listed with reference to step 704, or may be any other suitable gas used in a plasma generation process.

Step 716 may further include supplying a third magnitude of power to the coil to form an electric field through the container to form the second plasma, step 720. Because charged particles are already present in the container prior to the formation of the electric field, the charged particles serve as initiators for generating the second plasma. As a result, generation of the second plasma may occur with the use of less power than that required to form the first plasma. In this regard, an amount of RF current and thus, the third magnitude of power, supplied to the coil for the formation of the second plasma may be less than the amount of RF current and first magnitude of power employed to form the first plasma. It will be appreciated that the particular magnitude of power suitable for causing capacitive coupling and inductive coupling may depend on system designs. In any case, the third magnitude of power is a magnitude that is sufficient to cause the coil to operate in the capacitive mode and to transition into the inductive mode. Using the example in which the system is designed to operate at a power of about 2 kilowatts, a magnitude of power in a range of from about 1000 watts to about 1400 watts may be employed to transition from the capacitive mode to the inductive mode. In other embodiments, the particular current, voltage, and power selected to form the second plasma may depend on configurations and dimensions of the container and the coil.

In addition to or as an alternative to using less power, the presence of the charged particles within the container may allow the generation of the second plasma to occur more rapidly than the generation of the first plasma. For example, as noted above, generation of the first plasma may include repeated ignition attempts, which may take up to 5 seconds. In contrast, generation of the second plasma may occur after a single attempt. Thus, the second plasma may be generated within a period of 0.1 second to 0.5 second. The particular length of time needed to generate the second plasma may be longer or shorter than the aforementioned range and may depend on factors such as the current supplied to the system, the number of charged particles within the container, the particular configuration of the container, the processing gas used to form the second plasma, and the like.

Next, the second plasma may be used in various processes in which plasma may be employed to alter a surface of a second workpiece, step 722. Step 722 may be performed in a manner similar to step 708 described above. For example, in accordance with an exemplary embodiment, a continuous supply of the second processing gas may be fed into the container and allowed to circulate with the second plasma and through the electric field, and RF current is continuously supplied to the coil such that the inductively-coupled electric field within the chamber is maintained. In an exemplary embodiment of the present invention, if fluorine radicals are formed, some of reactive fluorine radicals may flow through the plasma chamber, through a showerhead, and may deposit on the workpiece, while another portion of the reactive fluorine radicals may recirculate within the plasma chamber before depositing onto the workpiece. After the workpiece is processed, it may be moved to another portion of the system. After step 722 is performed, the method 700 may proceed to step 710, where charged particles of the second plasma are extracted and stored. Subsequently, one or more of steps 712, 714, 716, 718, 720, and 722 may be performed and/or repeated until processing of the workpiece and/or a subsequent workpiece is completed.

System and methods have now been provided that provide improved plasma generation capabilities over conventional systems. The above-described plasma generator systems experience a reduced downtime between plasma generation processes as compared to conventional systems, and they do so while reducing exposure of surrounding system components to high amounts of power. As a result, the improved plasma generator systems now include components, such as RF components, gas flow distribution receptacles and tubes, having improved useful lives compared to components of conventional plasma generator systems. Additionally, maintenance costs of the systems are reduced as well.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A plasma generator system comprising:
   a container comprising an insulating material;
   a processing gas source in flow communication with the container and adapted to supply a processing gas thereto;
   a coil disposed around the container;
   an energy source electrically coupled to the coil; and
   a controller operatively coupled to the energy source, wherein:
   the controller is configured to provide commands to the energy source to supply a first magnitude of power to the coil to generate a first electric field within the container and to form a first plasma when a first portion of the processing gas flows therethrough, the first plasma including charged particles;
   the controller is further configured to provide commands to the energy source to supply a second magnitude of power to the coil, the second magnitude of power being less than the first magnitude of power and to extract a portion of the charged particles from the first plasma and to store the extracted portion of the charged particles on the insulating material of the container; and
   the controller is further configured to provide commands to the energy source to supply a third magnitude of power to the coil, the third magnitude of power being greater than the second magnitude of power, to generate a second electric field within the container and to form a second plasma from the extracted portion of the charged particles and a second portion of the processing gas.

2. The plasma generator system of claim 1, wherein, after the extracted portion of the charged particles are stored, the controller is further configured to provide commands to the energy source to supply a fourth magnitude of power to the coil, the fourth magnitude of power being less than the second magnitude of power, thereby reducing a quantity of charged particles within the container.

3. The plasma generator of claim 1, wherein the second magnitude of power is in a range of about 0.05% to about 20% of the first magnitude of power.

4. The plasma generator of claim 1, wherein the first magnitude of power is in a range of about 1000 watts to about 2000 watts and the second magnitude of power in is in a range of about 50 watts to about 400 watts.

5. The plasma generator of claim 1, wherein the controller is selected from the group consisting of an analog controller, a discrete logic controller, a programmable array controller, a programmable logic controller, a microprocessor, and a computer.

6. The plasma generator of claim 1, wherein the controller is configured to determine a magnitude of power, the magnitude of power determination being provided as a part of the commands to the energy source.

7. The plasma generator of claim 1, wherein the controller is operatively coupled to the processing gas source and configured to provide commands to the processing gas source to supply a specific amount of the processing gas to the container.

8. The plasma generator of claim 1, wherein the first magnitude of power is sufficient to transition the plasma generator system from a capacitive mode to an inductive mode.

9. The plasma generator of claim 1, wherein the first magnitude of power is in a range of about 1000 watts to about 2000 watts.

10. The plasma generator of claim 1, wherein the first magnitude of power is in a range of about 1000 watts to about 5000 watts.

11. The plasma generator of claim 1, wherein the first magnitude of power is in a range of about 1200 watts to about 10,000 watts.

12. The plasma generator of claim 1, wherein the controller is operatively coupled to the processing gas source and configured to provide commands to the processing gas source to supply a specific amount of the processing gas to the container and control timing of supplying the process gas to the container relative to supplying the first magnitude of power to the coil.

13. The plasma generator of claim 1, wherein switching from the first magnitude of power to the second magnitude of power transitions the plasma generator system from an inductive mode to a capacitive mode.

14. The plasma generator of claim 13, wherein the capacitive mode associated with the second magnitude of power directs the charged particles towards the insulating material of the container.

15. The plasma generator of claim 13, wherein the capacitive mode is maintained for a predetermined period of time in a range of about 0.1 seconds to about 1.5 seconds.

16. The plasma generator of claim 1, wherein a ratio of the second magnitude of power to the first magnitude of power is in a range of about 0.05% to about 20%.

17. The plasma generator of claim 1, wherein the second magnitude of power is in a range of about 50 watts to about 1200 watts.

18. The plasma generator of claim 1, wherein the second magnitude of power is in a range of about 50 watts to about 1000 watts.

19. The plasma generator of claim 1, wherein the second magnitude of power is in a range of about 50 watts to about 400 watts.

20. The plasma generator of claim 1, wherein switching from the second magnitude of power to the third magnitude of power transitions the plasma generator system from a capacitive mode to an inductive mode.

* * * * *